United States Patent
Hess et al.

(10) Patent No.: US 7,493,590 B1
(45) Date of Patent: Feb. 17, 2009

(54) PROCESS WINDOW OPTICAL PROXIMITY CORRECTION

(75) Inventors: Carl Hess, Los Altos, CA (US); Ruifang Shi, Cupertino, CA (US); Gaurav Verma, Sunnyvale, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 297 days.

(21) Appl. No.: 11/549,943

(22) Filed: Oct. 16, 2006

Related U.S. Application Data

(60) Provisional application No. 60/806,978, filed on Jul. 11, 2006.

(51) Int. Cl.
G06F 17/50 (2006.01)
G06F 19/00 (2006.01)
G06F 17/17 (2006.01)
G03F 1/00 (2006.01)
G21K 5/00 (2006.01)

(52) U.S. Cl. .......................... 716/21; 700/97; 700/120; 700/121; 430/5; 378/35

(58) Field of Classification Search .................. 716/21; 700/97, 120, 121; 430/5; 378/35
See application file for complete search history.

(56) References Cited

U.S. PATENT DOCUMENTS

| | | | | |
|---|---|---|---|---|
| 6,803,554 B2 * | 10/2004 | Ye et al. | ................... | 250/208.1 |
| 6,806,456 B1 * | 10/2004 | Ye et al. | ................... | 250/208.1 |
| 6,828,542 B2 * | 12/2004 | Ye et al. | ................... | 250/208.1 |
| 6,884,984 B2 * | 4/2005 | Ye et al. | ................... | 250/208.1 |
| 6,969,837 B2 * | 11/2005 | Ye et al. | ................... | 250/208.1 |
| 6,969,864 B2 * | 11/2005 | Ye et al. | ................... | 250/559.4 |
| 7,030,966 B2 * | 4/2006 | Hansen | ................... | 355/67 |
| 7,053,355 B2 * | 5/2006 | Ye et al. | ................... | 250/208.1 |
| 7,245,356 B2 * | 7/2007 | Hansen | ................... | 355/67 |
| 7,372,540 B2 * | 5/2008 | Hansen | ................... | 355/53 |
| 2003/0226951 A1 * | 12/2003 | Ye et al. | ................... | 250/208.1 |
| 2004/0119036 A1 * | 6/2004 | Ye et al. | ................... | 250/559.45 |
| 2004/0140418 A1 * | 7/2004 | Ye et al. | ................... | 250/208.1 |
| 2004/0156030 A1 * | 8/2004 | Hansen | ................... | 355/67 |
| 2004/0222354 A1 * | 11/2004 | Ye et al. | ................... | 250/208.1 |
| 2004/0232313 A1 * | 11/2004 | Ye et al. | ................... | 250/208.1 |
| 2005/0210337 A1 * | 9/2005 | Chester et al. | ................. | 714/47 |
| 2005/0251771 A1 * | 11/2005 | Robles | ......................... | 716/5 |

(Continued)

OTHER PUBLICATIONS

U.S. Appl. No. 60/806,978, filed Jul. 11, 2006.

*Primary Examiner*—Phallaka Kik
(74) *Attorney, Agent, or Firm*—Joshua D. Isenberg; JDI Patent

(57) ABSTRACT

Optical proximity correction methods and apparatus are disclosed. A simulated geometry representing one or more printed features from a reticle is generated using an optical proximity correction (OPC) model that takes into account a reticle design and one or more parameters from a process window of a stepper. An error function is formed that measures a deviation between the simulated geometry and a desired design of the one or more printed features. The error function takes into account parameters ($p_0 \ldots p_J$) from across the process window in addition to, or in lieu of, a best focus and a best exposure for the stepper. The reticle design is adjusted in a way that reduces the deviation as measured by the error function, thereby producing an adjusted reticle design.

37 Claims, 3 Drawing Sheets

U.S. PATENT DOCUMENTS

| | | | |
|---|---|---|---|
| 2006/0000964 A1* | 1/2006 | Ye et al. | 250/208.1 |
| 2006/0048091 A1* | 3/2006 | Joshi et al. | 716/21 |
| 2006/0057471 A1* | 3/2006 | Schenau et al. | 430/5 |
| 2006/0078805 A1* | 4/2006 | Hansen | 430/5 |
| 2006/0095887 A1* | 5/2006 | Bigwood et al. | 716/19 |
| 2006/0110837 A1* | 5/2006 | Gupta et al. | 438/14 |
| 2006/0126046 A1* | 6/2006 | Hansen | 355/55 |
| 2006/0161452 A1 | 7/2006 | Hess | 705/1 |
| 2006/0234136 A1* | 10/2006 | Kim | 430/5 |
| 2006/0234137 A1* | 10/2006 | Kim | 430/5 |
| 2006/0236294 A1 | 10/2006 | Saidin et al. | 716/19 |
| 2007/0082277 A1* | 4/2007 | Matthew et al. | 430/5 |
| 2007/0174797 A1* | 7/2007 | Luo et al. | 716/4 |
| 2008/0180649 A1* | 7/2008 | Hansen | 355/67 |

* cited by examiner

PROCESS WINDOW OPTICAL PROXIMITY CORRECTION

CROSS-REFERENCE TO A RELATED APPLICATION

This application claims priority from co-pending provisional patent application Ser. No. 60/806,978, which was filed on Jul. 11, 2006, the entire disclosures of which are incorporated herein by reference.

FIELD OF THE INVENTION

This invention is related to substrate processing and more particularly to printing features onto substrates using optical lithography.

BACKGROUND OF THE INVENTION

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Such patterns may be repeatedly transferred to multiple different locations or "die" or a wafer using a lithography tool known as a "stepper".

Advanced techniques are often used in conjunction with lithography to help form the proper shapes of features of the device that are small compared to the wavelength of light used in the lithography. One of these advanced techniques is known as "Optical Proximity Correction" (OPC). In OPC local regions of the geometry to be printed are modified on the reticle to correct for known errors that are expected to occur during lithography.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1:
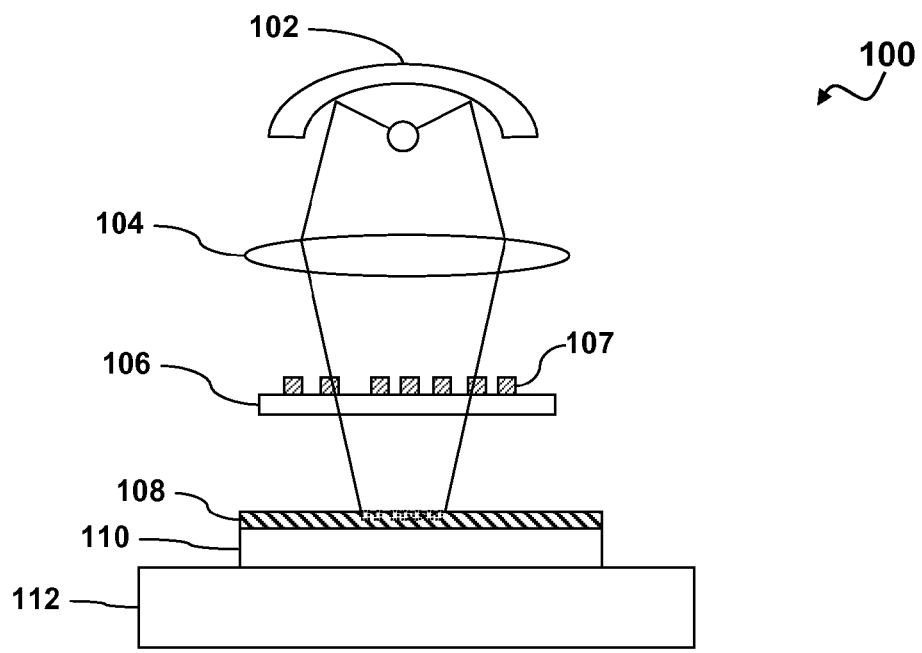
FIG. 1 is a schematic diagram of a stepper used in optical lithography.

Embodiments of the present invention develop an Optical Proximity Correction (OPC) strategy that optimizes the printing of desired geometries across the full process window that is to be used in a stepper. FIG. 1 illustrates a stepper 100 of a type that may be used in conjunction with embodiments of the present invention. Generally, the stepper 100 includes a light source 102, optics 104 and a substrate support 112. By way of example, the substrate support 112 may include a chuck, such as an electrostatic chuck or vacuum chuck. A substrate 110, e.g., a semiconductor wafer or any other suitable substrate, may be mounted to the substrate support 112. A surface of the substrate 110 may be coated with a resist that reacts upon to exposure to light from the light source 102. A reticle 106 is mounted between the optics 104 and substrate support 110. The reticle 106 includes a mask pattern 107 having features that are to be printed on a substrate 110. The optics 104 focus light from the source 102 through the pattern 107 on the reticle 106 forming a reduced image of the pattern 107 on the resist 108. The reaction between the light and the resist 108 allows portions of the resist 108 to be selectively removed thereby transferring the image to the resist. The substrate support 112 may include translation mechanisms that allow translate the substrate 110 horizontally so that multiple images of the pattern 107 may be formed at different locations on the substrate 110.

Figure 2A:
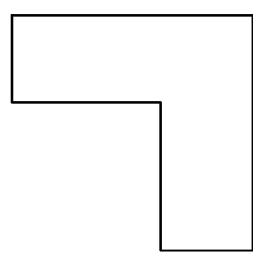
FIGS. 2A-2C are schematic diagrams illustrating optical proximity correction in the design of reticles for optical lithography.
Figure 2B:
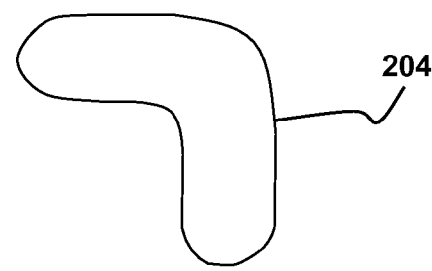

The size of features fabricated by photolithography has been decreasing, particularly in the filed of integrated circuit fabrication. As the feature size becomes comparable to or smaller than the size of the wavelength of light used in the photolithographic process the quality of the printed image may be affected by errors. FIGS. 2A-2B illustrate the problem. As shown in FIG. 2A, a feature 202 is to be printed and is formed as part of the pattern 107 on the reticle 106. As a result of errors, a feature 204, shown in FIG. 2B, may actually be printed. Some errors may tend to round the sharp corners of the original feature 202 or broaden or narrow (pinch) lines making up the feature 202. In some cases the feature 202 may not print at all.

Figure 2C:
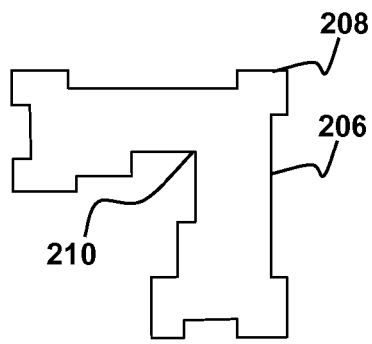

To compensate for such errors a technique known as optical proximity correction (OPC) has been developed. In OPC features on the reticle are modified to take into account errors of the type depicted in FIGS. 2A-2B. For example, as shown in FIG. 2C a reticle feature 206 of type shown in FIG. 2A may be modified by adding or removing serifs 208, 210 to outside or inside corners. The serifs 208, 210 compensate for the errors and result in the printing of a feature that more closely approximates the desired feature. The challenge of OPC techniques is to appropriately vary a desired feature pattern in order to generate a reticle design that produces a printed pattern closely approximating the desired feature pattern.

OPC techniques may be either rule-based or model-based. In rule-based OPC, a set of condition-based rules are formed based on the experience of lithographic experts which are then applied to the feature pattern to produce the reticle design. Rule-based OPC may stipulate, e.g., that a certain type of serif or other decoration be applied to an insider-corner geometry and a different serif or decoration be applied to an outside corner geometry.

Model-based OPC, which is typically used in more advanced processes, simulates the geometries that are printed on the substrate from a given reticle design at stipulated focus and exposure values that the stepper can use. Deviations from the printed result deduced by the model from the designer's intended result form an error measure which may be used in an optimization process. Line segments within the geometry of the reticle design are fragmented and then moved to allow very fine scale adjustments of the geometry that prints. By this method, the error between the modeled result and the designers intended result can be minimized. Previously, such techniques have evaluated the performance of the printed geometry at the best exposure and focus values. For example, the conventional method of constructing an error (cost) function E for OPC is to start with the following equation:

$$E = \sum_i [D(x_i) - S(x_i)]^2,$$

where $D(x_i)$ is the desired edge location for a simulation point $x_i$ and $S(x_i)$ is the simulated wafer edge location at the same simulation point under the best focus and exposure condition. By way of example, the simulated pattern may be simulated post resist development or post etch. A nonlinear optimization technique may then be applied to the error function. During each iteration, the line segments in the reticle design may be moved so that a new $S(x_i)$ is generated. Although such an optimization process may result in nearly perfect printing of features at the best focus and exposure it may still yield catastrophic defects at exposure values that are within the desired process window.

According to embodiments of the present invention, it is recognized that the printing of features with a stepper is affected by a process window for the lithographic process. The process window includes a range of values of process parameters that affect the outcome of the lithography process. Such parameters include, but are not limited to, stepper focus and exposure values. In advanced lithography the process window may shrink to a level that makes it difficult to obtain a high yield from one or more wafers. Hence, it is advantageous to optimize the OPC across the full process window rather than just optimize for the best focus and exposure conditions. Prior OPC techniques have not used knowledge of the process window or how the design will print on the wafer under different process conditions. Preferably, the OPC design trades off the needs at the best focus and exposure and at other points within the process window. A key component to such a trade-off is a detailed error function that appropriately weights the different parameters that affect printing by the stepper.

Embodiments of the invention use process window information to optimize OPC decoration. Fast modeling approaches make the use of such techniques a practical alternative to existing OPC techniques. Embodiments of the invention use an adaptable architecture that allows adjustment of the error function within an OPC decoration task.

Figure 3:
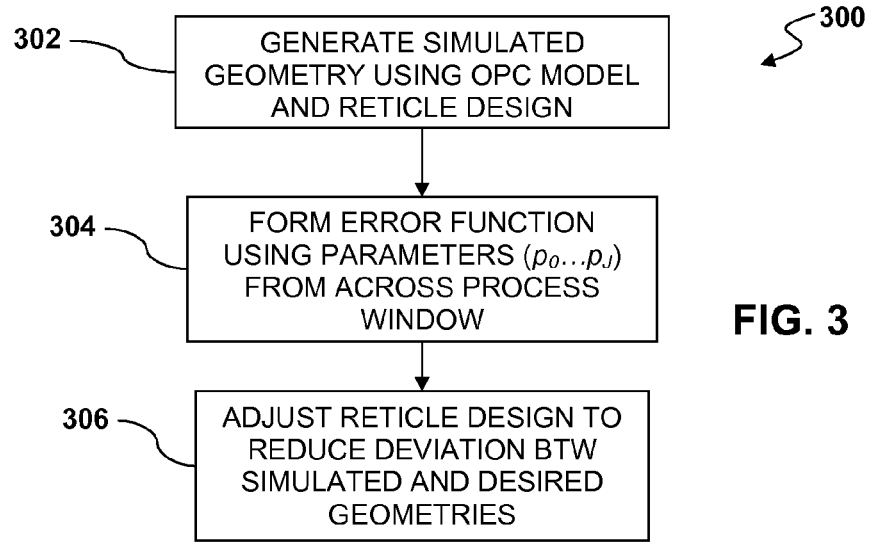
FIG. 3 is a flow diagram illustrating optical proximity correction according to an embodiment of the present invention.

According to embodiments of the present invention, optical proximity correction may take into account parameters from across the full process window. The flow diagram of FIG. 3 illustrates an example of a method 300 for optical proximity correction according to an embodiment of the present invention. A simulated geometry representing one or more printed features is generated using an optical proximity correction (OPC) model that takes into account a reticle design and one or more parameters from a process window of a lithographic process as indicated at block 302. An error function E that measures a deviation between the simulated geometry and a desired pattern of the one or more printed features is formed as indicated at block 304. The error function E takes into account parameters $(p_0 \ldots p_j)$ from across the process window in addition to, or in lieu of, a best focus and a best exposure for a stepper used in the lithographic process. The reticle design is adjusted in a way that reduces the deviation as measured by the error function, thereby producing an adjusted reticle design as indicated at block 306. For example, line segments within the simulated geometry of the reticle design may be fragmented and then moved to allow very fine scale adjustments of the geometry that prints. The process may iteratively repeat blocks 302 through 306 to optimize the reticle design.

Figure 4:
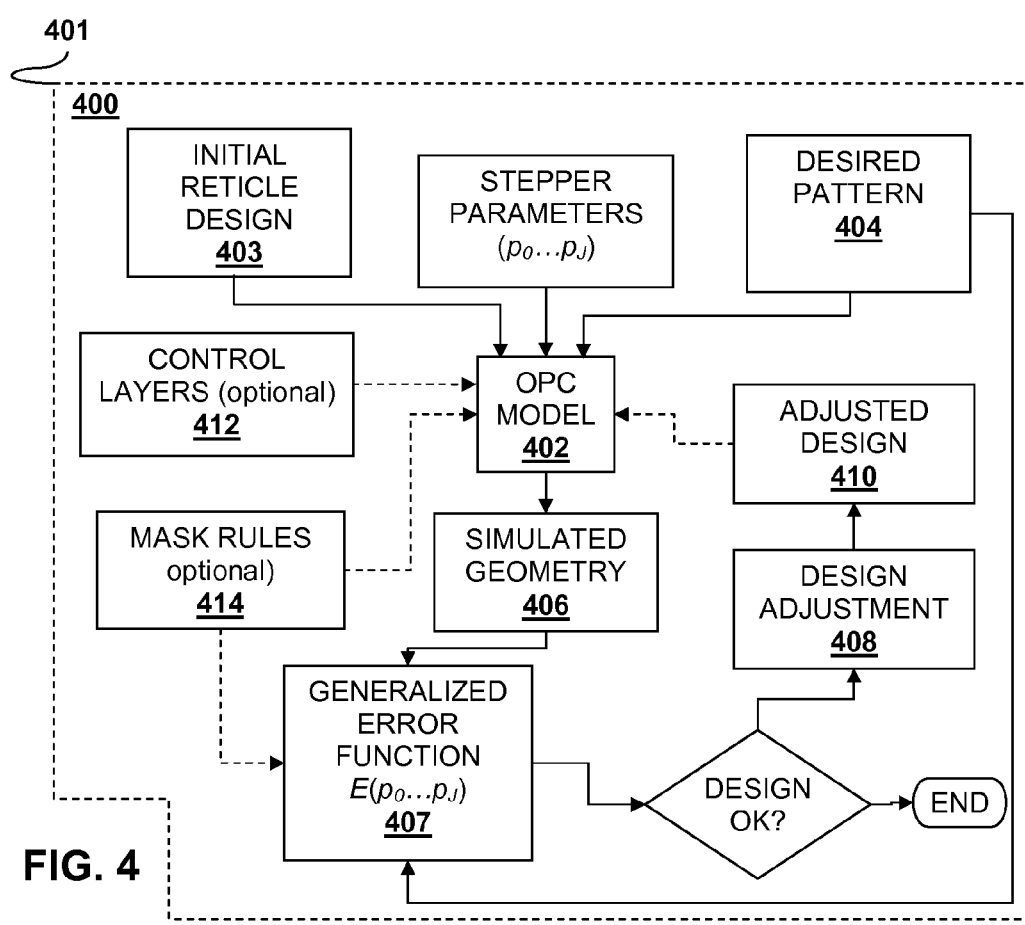
FIG. 4 is a block diagram of logic that may be used to implement the method of FIG. 3.

The method 300 may be implemented by suitably designed automated logic. Such logic may be implemented in hardware, software, or firmware. By way of example, as shown in FIG. 4, the method 300 may be implemented in the form of logic 400, which may be embodied in a processor readable medium and/or run on a suitably configured processor or processors 401. Software implementations of the logic 400 may utilize any software, such as Assembly, C++, JAVA or any of a number of other languages. Hardware implementations may utilize any suitable electronic circuit, such as an application specific integrated circuit ASIC.

The logic 400 generally includes an OPC model 402 that simulates the printing of a reticle design by a stepper. The OPC model 402 receives as inputs an initial reticle design 403 and a desired pattern 404 representing one or more feature patterns to be printed. The OPC model 402 also receives as inputs values representing parameters $p_0 \ldots p_j$ from the process window of a lithographic process. The values of these parameters affect the printing of the desired design. The OPC model 402 takes the parameters $p_0 \ldots p_j$ into account and generates a simulated geometry 406.

The simulated geometry 406 illustrates how the pattern on the reticle will be printed on a wafer at different values of the parameters $p_0 \ldots p_j$ based on the OPC model 402. The OPC model 402 may include one or more different models such as a resist model (e.g., a model of the resist that will be printed with the reticle design data on the wafer) and a lithography model (e.g., a model of the optical parameters of an exposure tool that will be used to print the reticle on the wafer and a model of other process steps involved in the lithography process such as develop and post exposure bake). Such models and/or parameters for such models may be acquired from one or more sources such as the PROLITH software, which is commercially available from KLA-Tencor.

In generating the simulated geometry 406, the OPC model 402 may take into account not just the lithography (wafer printing) process, but the full pattern transfer process, including any, some combination, or all of the following: etch, polishing, film deposition or growth, and any other steps that affect the final structure and topography of the device. Lithography parameters for which the simulated geometry 406 may be generated at different values can also include degree of partial coherence, illumination mode, numerical aperture, lens aberrations (e.g., Zernike coefficients), resist parameters (e.g., thickness, development rate model, lumped parameter model, Dill coefficients, and thermal diffusion coefficients) and/or film parameters (e.g., substrate reflectivity, thickness, anti-reflection coating properties, etc.)

The logic 400 also includes an error function generator 407 that compares the desired design 404 and the simulated geometry 406 to produce a generalized error function $E(p_0 \ldots p_j)$ that takes into account the parameters $p_0 \ldots p_j$ from across the process window of the stepper. The generalized error function $E(p_0 \ldots p_j)$ may be used as an input to a design adjustment module 408 that produces an adjusted reticle design 410. By way of example, the design adjustment module 408 may fragment line segments within the reticle design and then move the line segments to allow very fine scale adjustments of the reticle design and of the geometry that prints.

Through an iterative process, the adjusted reticle design 410 may be used as an input to the OPC model 402 for subsequent iterations. If the reticle design is acceptable, e.g., if the error function $E(p_0 \ldots p_j)$ is below some threshold, the iteration may terminate as indicated at block 409. Otherwise A final reticle design may be produced through iteration of the adjustment of the reticle design to optimize (e.g., minimize) the error function $E(p_0 \ldots p_j)$. The design adjustment module 408 may make use of any suitable algorithm for iteratively adjusting the adjusted reticle design 410.

For example, the design adjustment module 408 may use an algorithm that moves a mask edge may by an amount $\Delta$ given by:

$$\Delta = E(p_0 \ldots p_J) \cdot \left(\frac{\Delta_{MEM}}{\Delta_{WEM}}\right). \quad \text{Equation 1}$$

Where $\Delta_{MEM}$ is an incremental mask edge movement and $\Delta_{WEM}$ is a corresponding incremental wafer edge movement, which may be given by.

$$\Delta_{WEM} = \frac{1}{MEEF}, \quad \text{Equation 2}$$

where MEEF may be calculated from simulation of a small mask edge movement, e.g., by:

$$MEEF = \frac{WE - WE_0}{ME - ME_0}. \quad \text{Equation 3}$$

In Equation 3, WE is a new wafer edge position, $WE_0$ is an initial wafer edge position, ME is a new mask edge position and $ME_0$ is an initial mask edge position.

Conventionally, OPC uses a cost function that is based on the difference between desired edge locations and simulated edge locations at conditions of optical focus and exposure. In, embodiments of the invention the OPC model 402 and Error function $E(p_0 \ldots p_j)$ may include additional terms that cover different values of focus and exposure conditions as well as other parameters. Specifically, the parameters $p_0 \ldots p_j$ may include, but are not limited to:

Film Stack Parameters:
  Layer 1:
    Thickness (nm)
    Absorption Parameter A (1/μm)
    Absorption Parameter B (1/μm)
    Rate Constant C (cm²/mJ)
    Unexposed Refractive Index (real)
    Exposed Refractive Index (real)
    Refractive Index Change on Expose (real)
    Refractive Index Substrate (real)
    Refractive Index Substrate (Imaginary)
Resist Parameters:
  Resist Type: (e.g., Positive Chemically Amplified)
  Resist Material:
  Developer:
  Resist Thickness (nm)
  Absorption Parameter A (1/μm)
  Absorption Parameter B (1/μm)
  Rate Constant C (cm²/mJ)
  Unexposed Refractive Index (real)
  Exposed Refractive Index (real)
  Refractive Index Change on Expose (real)
  Thermal Decomposition Activation Energy (kcal/mol)
  Thermal Decomposition Ln(Ar) (1/sec)
  PEB Acid Diffusivity Activation Energy (kcal/mol)
  PEB Acid Diffusivity Ln(Ar) (nm²/sec)
  PEB Base Diffusivity Activation Energy (kcal/mol)
  PEB Base Diffusivity Ln(Ar) (nm²/sec)
  Amplification Reaction Order
  Amplification Reaction Activation Energy (kcal/mol)
  Amplification Reaction Ln(Ar) (1/sec)
  Diffusion-Controlled Reaction Activation Energy (kcal/mol)
  Diffusion-Controlled Reaction Ln(Ar) (1/sec)
  Acid Evaporation Activation Energy (kcal/mol)
  Acid Evaporation Ln(Ar) (1/sec)
  Bulk Acid Loss Activation Energy (kcal/mol)
  Bulk Acid Loss Ln(Ar) (1/sec)
  Relative Quencher Concentration
  Room Temperature Diffusion Length (nm)
  Acid Diffusivity Variation
  Reacted/Unreacted Acid Diffusivity Ratio
  Exponential Acid Diffusivity Factor
  Base Diffusivity Variation
  Development $R_{max}$ (nm/s)
  Development $R_{max}$ (nm/s)
  Development $R_{resin}$ (nm/s)
  Development n
  Development I
  Relative Surface Rate
  Inhibition Depth (nm)
Coat and Prebake Parameters
  Prebake time (sec)
  Prebake Temperature (° C.)
Imaging Tool Parameters
  Source Shape:
  Illumination Spectrum:
  Pupil Filter:
  Aberrations:
  Illumination Polarization:
  Immersion Enabled:
  Wavelength (nm)
  Wavelength Range (nm)
  Numerical Aperture
  Reduction Ratio
  Flare
  Annular Inner Sigma
  Annular Outer Sigma
Exposure and Focus Parameters
  Exposure (mJ/cm²) (e.g., 46)
  Focus (μm) (e.g., 0)
Post Exposure Bake Parameters
  PEB Time (sec)
  PEB Temperature (° C.)
  Contaminant Surface Concentration
  Contaminant Diffusion Length (nm)
Development Parameters
  Develop Time (sec)
Etch Parameters
  Number of Etch Stages
  Stage 1
    Etch Time (sec)

Ion Spread (deg.)
Horizontal Rate (nm/sec)
Vertical Rate (nm/sec)
Horizontal Rate (nm/sec)
Vertical Rate (nm/sec)
Faceting Those of skill in the art will be familiar with the meanings of the above parameters.

The error function $E(p_0 \ldots p_J)$ may take on any suitable form. By way of example, and without limitation, the error function $E(p_0 \ldots p_J)$ may have the form:

$$E = \sum_{p_1 \ldots p_J} w(p_1 \ldots p_J) \sum_i [D(x_i) - S(x_i, p_1 \ldots p_J)]^2, \quad \text{Equation 4 or}$$

$$E = \sum_{p_1 \ldots p_J} w(p_1 \ldots p_J) \sum_i w(x_i) [D(x_i) - S(x_i, p_1 \ldots p_J)]^2, \quad \text{Equation 5}$$

where $W(p_1 \ldots p_J)$ are weights dependent on values of the parameters $p_1 \ldots p_J$, $D(x_i)$ is a desired edge location for a point $x_i$ in the simulated geometry, $S(x_i, p_1 \ldots p_J)$ is a simulated edge location for the point $x_i$ under conditions determined by the values of the parameters $p_1 \ldots p_J$ and $w(x_i)$ are weights as functions of position $x_i$, The outer sum is taken over some set of values of the parameters $p_1 \ldots p_J$. The outer sum may be taken over different combinations of values of the process window parameters $p_1 \ldots p_J$. For example, in the case of focus and exposure, each weight may be associated with a different combination of focus and exposure values and the sum may be taken over a set of such combinations. The best focus $f_o$ and best exposure $e_o$ may be weighted as more important the focus and exposure values near the edge of the process window.

The weights $w(p_1 \ldots p_J)$ may take on any suitable value. By way of example each weight $w(p_1 \ldots p_J)$ may have the same value W. For example, if N is a total number of values of the parameters $p_1 \ldots p_J$ the value W may be given by W=1/N.

Alternatively, each weight $w(p_1 \ldots p_J)$ may be determined by $$\left[ \sum_{j=1}^{J} \left( \frac{p_j - p_{j0}}{\Delta p_j} \right)^2 \right]^{-1},$$

where each $p_j$ is a value of a parameter, $p_{j0}$ is an optimal value of the parameter $p_j$ and $\Delta p_j$ is a value range for the parameter $p_j$. By way of example, if there are only two parameters (i.e., J=2), focus f and exposure e, the weights $w(p_1 \ldots p_J)$ may take on the form $$w(f, e) = \frac{1}{\left[ \left( \frac{f - f_0}{\Delta f} \right)^2 + \left( \frac{e - e_0}{\Delta e} \right)^2 \right]},$$

where $f_0$ is a nominal (e.g., best) focus and $e_0$ is a nominal (e.g., best) exposure, $\Delta f$ is a depth of focus and $\Delta e$ is an exposure range.

Similarly, the position-dependent weights $w(x_i)$ may take on any suitable value. For example, all positions may be equally weighted, e.g., with each $w(x_i)=1$, in which case Equation 5 would be equivalent to Equation 1. Alternatively, critical locations $x_i$ within the reticle design may be given greater weight values $w(x_i)$ than less critical locations of the design.

In some embodiments of the invention, the OPC model 402 may be based on a simulation of a sampling of a selected subset of edge points from the geometry to be printed. Alternatively, the OPC model 402 may be a fast and accurate pixel image based model. A mask design may be rendered to a pixelized image and then simulated to a pixelized wafer print result. In such a model, the simulated geometry 406 may simulate every single pixel in one or more printed features. In such a case, the error function may have the form:

$$E = \sum_{p_1 \ldots p_J} w(p_1 \ldots p_J) \int ds \, [D(s) - S(s, p_1 \ldots p_J)]^2, \quad \text{Equation 6}$$

where $p_1 \ldots p_J$ are parameters from across the process window, $w(p_1 \ldots p_J)$ are weights dependent on values of the parameters $p_1 \ldots p_J$, $D(s)$ is a desired edge location for a point s in the simulated geometry and $S(s, p_1 \ldots p_J)$ is a simulated edge location for the point s under conditions determined by the values of the parameters $p_1 \ldots p_J$ and the integral is taken over all edge pixels in the one or more printed features. Position-dependent weights may be incorporated into the integral, in which case the Error function may have the form:

$$E = \sum_{p_1 \ldots p_J} w(p_1 \ldots p_J) \int ds \cdot w(s) [D(s) - S(s, p_1 \ldots p_J)]^2. \quad \text{Equation 7}$$

It is noted that generally, OPC is computationally intensive. Conventional OPC calculations for a single reticle may typically require the use of a massively parallel processor and may take several hours to complete. To simplify computation certain embodiments of the invention may make use of control layers to control the fragmentation of edge lines during design adjustment. As used herein, control layers refer to regions of the device (or reticle) for that are associated with different cost functions. For example, in regions of an integrated circuit chip having critical timing gates it is desirable for the control function to be more robust. Including additional terms makes the control function more robust. By contrast "dummy" areas of the chip that are not critical to its function may be associated with a cost function that is less robust.

One or more different control layers 412 may be applied to the OPC model 402 and/or error function $E(p_1 \ldots p_J)$. Each control layer 412 corresponds to a different portion of the reticle design. The control layers may be implemented, e.g., by applying different position-dependent weights $w(x_i)$ to different portions of the reticle design. The error function associated with a particular control layer may be adapted to one or more requirements of a corresponding portion of a design to be printed with the reticle. The one or more requirements of the corresponding portion of the design include a robustness of the design.

As used herein, the term robustness refers to a measure of sensitivity of the printed design to variations in process conditions. Robustness may be measured in terms of ranges of one or more process parameters for which the design prints as desired. A more robust design has a greater the range of process conditions for which the design prints properly. It is noted that different parts of the design may have different requirements for robustness and these requirements may be expressed in terms of the values of the position-dependent weights w($x_i$). Relatively greater values of the position-dependent weights w($x_i$) may be associated with locations $x_i$ within the design requiring greater robustness. Relatively smaller values of the position-dependent weights w($x_i$) may be associated with locations $x_i$ within the design that do not need to be so robust.

Figure 5:
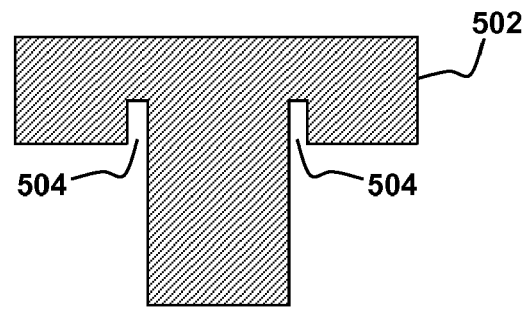
FIG. 5 is a schematic plan view diagram of a feature on a reticle illustrating the use of mask rules in conjunction with embodiments of the present invention.

In embodiments of the present invention generating the simulated geometry 406 may include applying one or more mask rules 414 to the OPC model 402. As used herein, mask rules are rules regarding how one can make a mask (reticle) that is reliable to make and that can be inspected acceptably. In some embodiments of the invention, it may be useful to include a check for compatibility of the resulting reticle design with mask rules. By way of example, a as depicted in FIG. 5, a given OPC may produce a particular shape for a feature 502. However, the shape of the feature 502 may be one that is not manufacturable on the reticle, e.g., due to narrow indentations 504. The OPC model 402 may apply the mask rules 414 to modify the simulated geometry 406.

Figure 6:
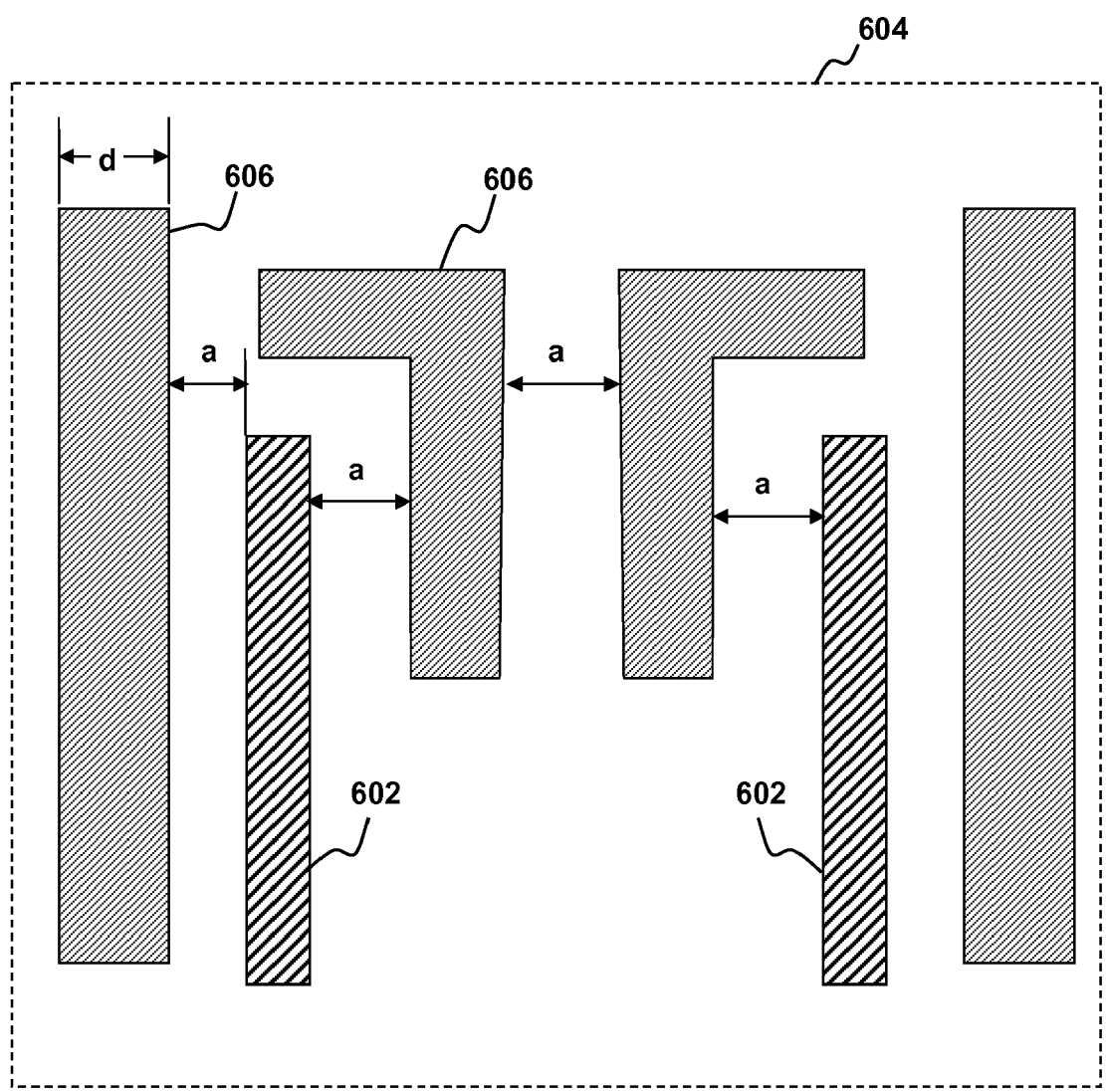
FIG. 6 is a schematic plan view diagram of a portion of a substrate illustrating the use of sub-resolution assist features (SRAFs) in conjunction with embodiments of the present invention.

It is noted that features appearing on a reticle that violate mask rules may not be a problem if such features are not to be printed on a substrate. Examples of features that may appear on a reticle but are not meant to be printed on a substrate include sub-resolution assist features (SRAFs). Examples of SRAFs include, but are not limited to features such as scattering bars. Such features may be important to making a design robust across the process window. As shown in FIG. 6, an SRAF 602 may be a feature on the reticle 604 that is thin enough compared to the wavelength of light used in the lithography process that the SRAF 602 doesn't print. However, the SRAFs 602 are positioned in such a way that they help neighboring features 606 print well. The features 606 may be characterized by a width d that is sufficiently large that the features 606 are printed on a substrate. The SRAFs 602 are typically several times thinner than neighboring features 606 that are printed. SRAFs 602 may be included on the reticle 604 to fill in gaps in an otherwise regular periodic arrangement of features 606 that are to be printed. The periodic arrangement may be characterized by a regular gap spacing a. As a result, the SFAFs 602 and features 606 act together as a diffraction grating. Diffraction of light by the grating may enhance printing of the features 606.

Embodiments of the present invention have substantial potential for application in the substrate processing arts. In particular, embodiments of the invention may potentially improve optimization of the yield of semiconductor wafers at more advanced nodes. Embodiments of the present invention take into account parameters that may significantly affect the yield of a set of wafers.

In alternative embodiments, individual optimizations may be performed at a variety of distinct process points. A combined correction may then be formed based on some weighted average of the different optimized corrections found to be needed for each of the process points. One could then reverify that the combined correction results in the desired printing of the features to be printed.

Embodiments of the present invention are equally applicable to lithographic processes including those using visible, ultraviolet, and deep ultraviolet illumination (e.g., 248 nm, 193 nm, and 157 nm light sources), electron beam lithography, or extreme ultraviolet lithography, e.g., using reflective masks and an exposure wavelength near 13 nm.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for optical proximity correction, comprising:
   generating a simulated geometry representing one or more printed features from a reticle using an optical proximity correction (OPC) model that takes into account a reticle design and one or more parameters from a process window of a lithographic process;
   forming an error function E that measures a deviation between the simulated geometry and a desired design of the one or more printed features, wherein the error function takes into account parameters ($p_0 \ldots p_J$) from across the process window in addition to, or in lieu of, a best focus and a best exposure for a stepper used in the lithographic process; and
   adjusting the reticle design in a way that reduces the deviation as measured by the error function, thereby producing an adjusted reticle design.

2. The method of claim 1 wherein the error function E has the form:

$$E = \sum_{p_1 \ldots p_J} w(p_1 \ldots p_J) \sum_i w(x_i) \cdot [D(x_i) - S(x_i, p_1 \ldots p_J)]^2,$$

where w($p_1 \ldots p_J$) are weights dependent on values of the parameters $p_1 \ldots p_J$, D($x_i$) is a desired edge location for a point $x_i$ in the simulated geometry, S($x_i, p_1 \ldots p_J$) is a simulated edge location for the point $x_i$ under conditions determined by the values of the parameters $p_1 \ldots p_J$, and w($x_i$) are weights as functions of position for the point $x_i$.

3. The method of claim 2, wherein each weight w($p_1 \ldots p_J$) has the same value W.

4. The method of claim 3 wherein W=1/N, where N is a total number of values of the parameters $p_1 \ldots p_J$.

5. The method of claim 2 wherein each weight w($p_1 \ldots p_J$) is determined by $$\left[\sum_{j=1}^{J} \left(\frac{p_j - p_{j0}}{\Delta p_j}\right)^2\right]^{-1},$$

where each $p_j$ is a value of a parameter, $p_{j0}$ is an optimal value of the parameter $p_j$ and $\Delta p_j$ is a value range for the parameter $p_j$.

6. The method of claim 2 wherein the parameters $p_1 \ldots p_J$ include a focus value and an exposure value.

7. The method of claim 2 wherein the parameters $p_1 \ldots p_J$ include Film Stack Parameters and/or Resist Parameters, and/or Coat and Prebake Parameters, and/or Imaging Tool Parameters and/or Exposure and Focus Parameters, and/or Post Exposure Bake Parameters, and/or Development Parameters and/or Etch Parameters.

8. The method of claim 7 wherein the Film Stack Parameters include a thickness, one or more Absorption Parameters, a Rate Constant, an Unexposed Refractive Index, and Exposed Refractive Index, a Refractive Index Change on Expose, a Refractive Index Substrate, a Refractive Index Substrate.

9. The method of claim 7 wherein the Resist Parameters include one or more parameters from the group of a Resist Type, a Resist Material, Developer, Resist Thickness, one or more Absorption Parameters, a Rate Constant, Unexposed Refractive Index, Exposed Refractive Index, a Refractive Index Change on Expose, a Thermal Decomposition Activation Energy, a Thermal Decomposition Ln(Ar) (1/sec), a PEB Acid Diffusivity Activation Energy, a PEB Acid Diffusivity Ln(Ar), a PEB Base Diffusivity Activation Energy (kcal/mol), a PEB Base Diffusivity Ln(Ar), an Amplification Reaction Order, an Amplification Reaction Activation Energy, an Amplification Reaction Ln(Ar), a Diffusion-Controlled Reaction Activation Energy, a Diffusion-Controlled Reaction Ln(Ar), an Acid Evaporation Activation Energy, an Acid Evaporation Ln(Ar), a Bulk Acid Loss Activation Energy, a Bulk Acid Loss Ln(Ar), a Relative Quencher Concentration, a Room Temperature Diffusion Length, an Acid Diffusivity Variation, a Reacted/Unreacted Acid Diffusivity Ratio an Exponential Acid Diffusivity Factor, a Base Diffusivity Variation, a Development $R_{max}$, a Development $R_{min}$, a Development $R_{resin}$, a Development n, a Development I, a Relative Surface Rate, and an Inhibition Depth.

10. The method of claim 7 wherein the Coat and Prebake Parameters include a Prebake time and/or a prebake Temperature (° C.).

11. The method of claim 7 wherein the Imaging Tool Parameters include one or more of the parameters from the group of a Source Shape, an Illumination Spectrum, a Pupil Filter, Aberrations, Illumination Polarization, Immersion Enabled, Wavelength, Wavelength Range, Numerical Aperture, Reduction Ratio, Flare, Annular Inner Sigma and Annular Outer Sigma.

12. The method of claim 7 wherein the Post Exposure Bake (PEB) Parameters include one or more parameters from the group of PEB Time, PEB Temperature, Contaminant Surface Concentration and Contaminant Diffusion Length.

13. The method of claim 7 wherein the Development Parameters include a Develop Time.

14. The method of claim 7 wherein the Etch Parameters include one or more parameters selected from the group of Number of Etch Stages, Etch Time, Ion Spread, Horizontal Rate, Vertical Rate, Horizontal Rate and Faceting.

15. The method of claim 1 wherein the simulated geometry simulates every edge pixel in the one or more printed features.

16. The method of claim 15 wherein the error function E has the form:

$$E = \sum_{p_1 \ldots p_J} w(p_1 \ldots p_J) \int ds \, [D(s) - S(s, p_1 \ldots p_J)]^2,$$

where $p_1 \ldots p_J$ are parameters from across the process window, $w(p_1 \ldots p_J)$ are weights dependent on values of the parameters $p_1 \ldots p_J$, $D(s)$ is a desired edge location for a point s in the simulated geometry and $S(s, p_1 \ldots p_J)$ is a simulated edge location for the point s under conditions determined by the values of the parameters $p_1 \ldots p_J$ and the integral is taken over all edge pixels in the one or more printed features.

17. The method of claim 15 wherein the error function E has the form:

$$E = \sum_{p_1 \ldots p_J} w(p_1 \ldots p_J) \int ds \cdot w(s) \, [D(s) - S(s, p_1 \ldots p_J)]^2,$$

where $p_1 \ldots p_J$ are parameters from across the process window, $w(p_1 \ldots p_J)$ are weights dependent on values of the parameters $p_1 \ldots p_J$, $w(s)$ are position-dependent weights, $D(s)$ is a desired edge location for a point s in the simulated geometry and $S(s, p_1 \ldots p_J)$ is a simulated edge location for the point s under conditions determined by the values of the parameters $p_1 \ldots p_J$ and the integral is taken over all edge pixels in the one or more printed features.

18. The method of claim 1 wherein forming an error function E includes applying one or more different control layers to the error function wherein each control layer corresponds to a different portion of the reticle design and wherein the error function associated with a particular control layer is adapted to one or more requirements of a corresponding portion of a design to be printed with the reticle.

19. The method of claim 18 wherein the one or more requirements of the corresponding portion of the design include a robustness of printing of the design with respect to variations in process conditions.

20. The method of claim 1 wherein the reticle design includes one or more sub-resolution assist features.

21. The method of claim 1 wherein generating a simulated geometry includes applying one or more mask rules to the OPC model.

22. The method of claim 1 wherein adjusting the reticle design includes fragmenting and moving one or more line segments within a geometry of the reticle design.

23. The method of claim 1 wherein adjusting the reticle design includes performing individual optimizations at a variety of distinct process points and forming a combined correction based on a weighted average of different optimized corrections found to be needed for each of the process points.

24. The method of claim 23, further comprising verifying that the combined correction results in a desired printing of the one or more printed features.

25. An optical proximity correction apparatus, comprising:
a processor having logic adapted to implement a method for optical proximity correction, the logic including:
an optical proximity correction (OPC) model configured to generate a simulated geometry representing one or more printed features from a reticle using an optical proximity correction (OPC) model that takes into account a reticle design and one or more parameters from a process window of a lithographic process;
an error function generator configured to form an error function E that measures a deviation between the simulated geometry and a desired design of the one or more printed features, wherein the error function takes into account parameters $(p_0 \ldots p_J)$ from across the process window in addition to, or in lieu of, a best focus and a best exposure for a stepper used in the lithographic process; and a design adjustment module configured to adjust the reticle design in a way that reduces the deviation as measured by the error function, thereby producing an adjusted reticle design.

26. The apparatus of claim 25 wherein the error function E has the form:

$$E = \sum_{p_1...p_J} w(p_1...p_J) \sum_i w(x_i)[D(x_i) - S(x_i, p_1...p_J)]^2,$$

where $p_1 \ldots p_J$ are parameters from across the process window, $w(p_1 \ldots p_J)$ are weights dependent on values of the parameters $p_1 \ldots p_J$, $D(x_i)$ is a desired edge location for a point $x_i$ in the simulated geometry $w(x_i)$ are weights as functions of position for the point $x_i$, $S(x_i, p_1 \ldots p_J)$ is a simulated edge location for the point $x_i$ under conditions determined by the values of the parameters $p_1 \ldots p_J$, and $w(x_i)$ are weights as functions of position for the point $x_i$.

27. The apparatus of claim 26 wherein the parameters $p_1 \ldots p_J$ include a focus value and an exposure value.

28. The apparatus of claim 26, wherein each weight $w(p_1 \ldots p_J)$ has the same value W.

29. The apparatus of claim 28 wherein W=1/N, where N is a total number of values of the parameters $p_1 \ldots p_J$.

30. The apparatus of claim 26 wherein each weight $w(p_1 \ldots p_J)$ is determined by $$\left[\sum_{j=1}^{J}\left(\frac{p_j - p_{j0}}{\Delta p_j}\right)^2\right]^{-1},$$

where each $p_j$ is a value of a parameter, $p_{j0}$ is an optimal value of the parameter $p_j$ and $\Delta p_j$ is a value range for the parameter $p_j$.

31. The apparatus of claim 25 wherein the simulated geometry simulates every edge pixel in the one or more printed features.

32. The apparatus of claim 31 wherein the error function E has the form:

$$E = \sum_{p_1...p_J} w(p_1...p_J) \int ds \, [D(s) - S(s, p_1...p_J)]^2,$$

where $p_1 \ldots p_J$ are parameters from across the process window, $w(p_1 \ldots p_J)$ are weights dependent on values of the parameters $p_1 \ldots p_J$, $D(s)$ is a desired edge location for a point s in the simulated geometry and $S(s, p_1 \ldots p_J)$ is a simulated edge location for the point s under conditions determined by the values of the parameters $p_1 \ldots p_J$ and the integral is taken over all edge pixels in the one or more printed features.

33. The apparatus of claim 31 wherein the error function E has the form:

$$E = \sum_{p_1...p_J} w(p_1...p_J) \int ds \cdot w(s) \, [D(s) - S(s, p_1...p_J)]^2,$$

where $p_1 \ldots p_J$ are parameters from across the process window, $w(p_1 \ldots p_J)$ are weights dependent on values of the parameters $p_1 \ldots p_J$, $w(s)$ are position-dependent weights, $D(s)$ is a desired edge location for a point s in the simulated geometry and $S(s, p_1 \ldots p_J)$ is a simulated edge location for the point s under conditions determined by the values of the parameters $p_1 \ldots p_J$ and the integral is taken over all edge pixels in the one or more printed features.

34. The apparatus of claim 25 wherein error function generator is configured to apply one or more different control layers to the error function wherein each control layer corresponds to a different portion of the reticle design and wherein the error function associated with a particular control layer is adapted to one or more requirements of a corresponding portion of a design to be printed with the reticle.

35. The apparatus of claim 34 wherein the one or more requirements of the corresponding portion of the design include a robustness requirement for the corresponding portion.

36. The apparatus of claim 25 wherein the reticle design includes one or more sub-resolution assist features.

37. A processor readable medium having embodied therein processor readable instructions including instructions implementing a method for optical proximity correction, the method comprising:

generating a simulated geometry representing one or more printed features from a reticle using an optical proximity correction (OPC) model that takes into account a reticle design and one or more parameters from a process window of a lithographic process;

forming an error function E that measures a deviation between the simulated geometry and a desired design of the one or more printed features, wherein the error function takes into account parameters ($p_0 \ldots p_J$) from across the process window in addition to, or in lieu of, a best focus and a best exposure for a stepper used in the lithographic process;

adjusting the reticle design in a way that reduces the deviation as measured by the error function, thereby producing an adjusted reticle design.

* * * * *